United States Patent [19]
Tulintseff

[11] Patent Number: 6,023,210
[45] Date of Patent: Feb. 8, 2000

[54] INTERLAYER STRIPLINE TRANSITION

[75] Inventor: Ann N. Tulintseff, Seattle, Wash.

[73] Assignee: California Institute of Technology

[21] Appl. No.: 09/034,044

[22] Filed: Mar. 3, 1998

[51] Int. Cl.[7] .............................. H01P 3/08; H01P 5/107
[52] U.S. Cl. .......................... 333/238; 333/33; 333/246; 333/27
[58] Field of Search .................................. 333/24 R, 27, 333/33, 34, 238, 246

[56] References Cited

U.S. PATENT DOCUMENTS

| | | | |
|---|---|---|---|
| 4,080,579 | 3/1978 | Fassett | 333/246 X |
| 5,093,639 | 3/1992 | Franchi et al. | 333/24 R |
| 5,471,181 | 11/1995 | Park | 333/246 |
| 5,532,643 | 7/1996 | Kuffner et al. | 333/246 |

FOREIGN PATENT DOCUMENTS

| | | | |
|---|---|---|---|
| 54-131851 | 10/1979 | Japan | 333/238 |
| 3-129902 | 6/1991 | Japan | 333/238 |

OTHER PUBLICATIONS

Schwab et al., "On the Design of Planar Microwave Componets Using Multilayer Structures," *IEEE Transactions on Microwave Theory*, vol. 40, No. 1, (Jan. 1992), pp. 67–72.

Herman et al., "Novel Techniques for Millimeter–Wave Packages," *IEEE Trasanctions on Microwave Theory*, vol. 43, No. 7 (Jul. 1995), pp. 1516–1523.

*Primary Examiner*—Robert Pascal
*Assistant Examiner*—Barbara Summons
*Attorney, Agent, or Firm*—Fish & Richardson P.C.

[57] ABSTRACT

A improved stripline transition in a planar configuration for coupling signals between two signal planes by electromagnetic coupling.

19 Claims, 7 Drawing Sheets

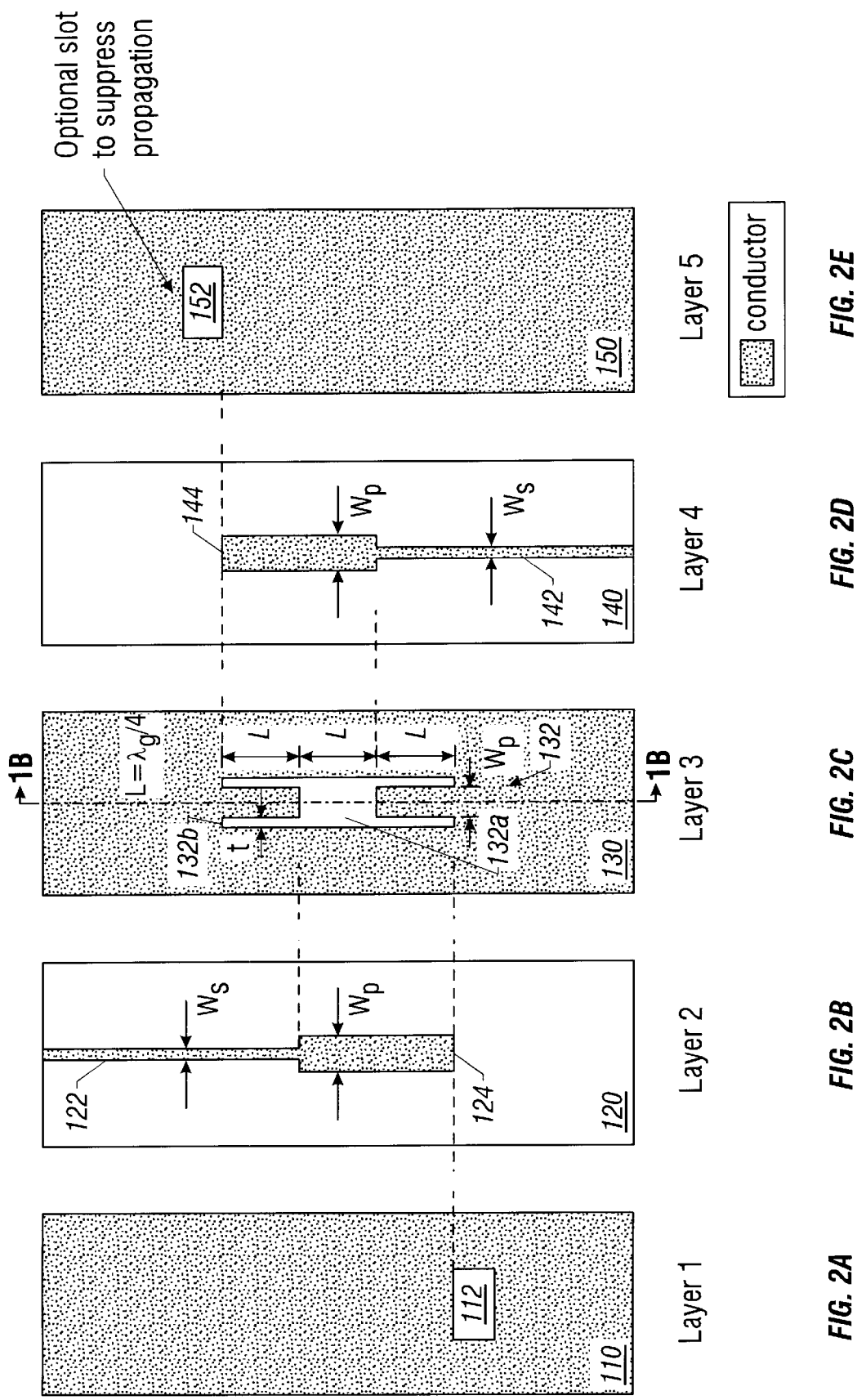

INTERLAYER STRIPLINE TRANSITION

ORIGIN OF THE INVENTION

The invention described herein was made in the performance of work under a NASA contract, and is subject to the provisions of Public Law 96-517 (35 U.S.C. 202) in which the Contractor has elected to retain title.

FIELD OF THE INVENTION

The present invention relates to electromagnetic signal coupling, and more particularly, to electronic devices having an interlayer stripline or microstrip transition.

BACKGROUND OF THE INVENTION

A transmission line is widely used to guide a radio frequency signal ("RF") between two points along a particular path in an RF device or RF system. Various configurations of transmission lines have been developed for different RF applications, including but not limited to, open two-wire line, rectangular waveguide, ridged waveguide, coaxial cable, single-dielectric microstrip line, and triplate stripline. For a given application, the use of a particular type of transmission line is usually based on device parameters such as the operating frequency, power level, mass, volume, and performance requirements.

In particular, multilayer transmission lines have been used to reduce the size and mass of microwave circuits and to improve their performance. Commonly used transmission line configurations include a microstrip transmission line which is constructed by forming a conducting circuit on top of a dielectric substrate with a ground layer on the bottom of the substrate and a stripline transmission line which has a flat conductor disposed between two ground planes. Impedance matching may be accomplished by changing the dimension of the conducting features or strips. Such multilayer transmission lines may be constructed on metal-clad printed-circuit boards, or metal-clad planar dielectric materials and can be implemented in applications where volume and cost constraints predominate such as miniature microwave integrated circuits ("MMIC").

Many multilayer circuit configurations use stripline transmission lines in which the ground planes separate the various signal layers. Interlayer connections between the stripline transmission lines on different layers are conventionally accomplished by using vertical conductors directly connecting the center conductors of the stripline transmission lines of interest. These vertical connections, sometimes referred to as "vias", may be fabricated by using a "plated-through-hole" technique. The presence of vertical conductors in multilayer configurations adds manufacturing complexity and can lead to degraded device performance at high frequencies. In addition, as the frequency increases, additional vertical conductors may be required for suppressing unwanted modes. This further complicates the device and increases manufacturing cost.

Alternatively, the interlayer connections can be implemented by electromagnetic coupling without direct physical contact between stripline transmission lines on different layers. A stripline transmission line supports electromagnetic wave propagation between surfaces of both a conductor and a respective ground plane. An opening or slot formed in the ground plane can disturb the electromagnetic field to cause electromagnetic radiation at the slot. This radiation couples the electromagnetic energy from the stripline transmission line. If a second stripline transmission line is placed on the opposite side of the ground plane, the radiated energy from the slot will be coupled to the second transmission line.

Franchi et al. discloses a multilayer interconnecting scheme based on the above electromagnetic coupling through a rectangular slot of length of a quarter wavelength in a common ground plane in U.S. Pat. No. 5,093,636. Two striplines on two adjacent layers each are terminated by a longitudinal coupling unit which consists of an impedance matching section directly connected to the stripline and a coupling section extended from the impedance matching section. Both the impedance matching section and the coupling section are of a quarter-wavelength in length. The coupling sections of the two striplines are aligned with the rectangular slot in the common ground plane between two striplines.

U.S. Pat. No. 5,471,181 to Park describes a multilayer microwave circuit having a U-shaped coupling slot with an effective electrical length of one half wavelength in a common ground plane to interconnect two adjacent layers. A cavity formed by vertical conductors is implemented to enclose the U-shaped slot to reduce undesirable coupling to other transmission line modes.

The present invention uses a novel impedance matching and transition geometry to implement the transition between two stripline transmission lines on two adjacent signal layers in a multilayer circuit based on the electromagnetic coupling.

SUMMARY OF THE INVENTION

A transition between two mutually parallel stripline transmission lines on two adjacent signal layers in a multilayer circuit is accomplished by a coupling slot in a common conducting layer shared by the two striplines. Each stripline is connected to and terminated in the vicinity of the coupling slot with a wide conducting strip elongated along the stripline, herein referred to as a coupling electrode. The two coupling electrodes and the coupling slot are arranged to at least partially overlap with one another to form a transition waveguide that interconnects the two striplines. The characteristic impedances of the two stripline transmission lines are substantially the same and the dimension of the coupling electrodes are configured to match the characteristic impedance of the transition waveguide and to achieve efficient energy coupling between the two striplines.

A multilayered circuit according to one embodiment of the invention includes first, second, and third conducting layers sequentially spaced from and disposed to overlap one another to form a stack, a first stripline transmission line located between the first and second conducting layers to form a first waveguide of a first characteristic impedance for transmitting electromagnetic waves, and a second stripline transmission line parallel to the first stripline and located between the second and third conducting layers to form a second waveguide having the same characteristic impedance as the first waveguide.

The second conducting layer has a rectangular coupling slot that is elongated along the direction of the striplines to effect perturbation of the electromagnetic fields on surfaces of the second conducting layer. The coupling slot is approximately one quarter of a wavelength of the electromagnetic waves.

Two substantially identical planar coupling electrodes are respectively connected to and terminate the striplines. The coupling electrodes are substantially identical to each other and have a rectangular shape with a length of about one half of the wavelength. Each coupling electrode preferably extends one quarter of the wavelength beyond the coupling slot.

The transition waveguide is formed by the first conducting layer, the first and second coupling electrodes, and the third conducting layer to effect a transition impedance. The transition impedance and the impedance of the striplines are matched by, for example, adjusting the width of the first and second coupling electrodes.

The coupling slot may further include an additional narrow slit at each corner of the rectangular slot, which is parallel to the elongated direction, to effectively form a H-shaped aperture. The length of each narrow slit may be approximately one quarter wavelength and the width may be much less than one quarter wavelength. This H-shaped aperture can effectively improve the coupling efficiency of the transition waveguide.

An optional slot may be implemented in both the first and third conducting layers at a position corresponding to the end of the coupling electrodes to further improve the coupling efficiency.

These and other aspects and advantages of the present invention will become more apparent in light of the following detailed description, the accompanying drawings, and the claims.

BRIEF DESCRIPTION OF THE DRAWINGS

FIGS. 2A, 2B, 2C, 2D, and 2E are respective top views of the layers in the embodiment of FIG. 1A.

DETAILED DESCRIPTION OF THE INVENTION

The interlayer stripline transition of the invention is based on the electromagnetic coupling between the striplines on two adjacent signal layers in a multilayer circuit. A planar geometry is used to simplify the circuit integration and packaging and to reduce the manufacturing difficulty and cost of fabrication.

The concept of the invention is to transition from a first stripline transmission line with a characteristic impedance of $Z_{os}$ on a first layer to a second stripline transmission line with the same characteristic impedance of $Z_{os}$ on a different second layer by forming a parallel transmission line with a characteristic impedance of $Z_{op}$ between the first and second stripline transmission lines. The characteristic impedance of the parallel transmission line is configured to match that of the striplines (i.e., $Z_{os}=Z_{op}$) in order to substantially reduce or minimize the transmission loss.

Figure 1A:
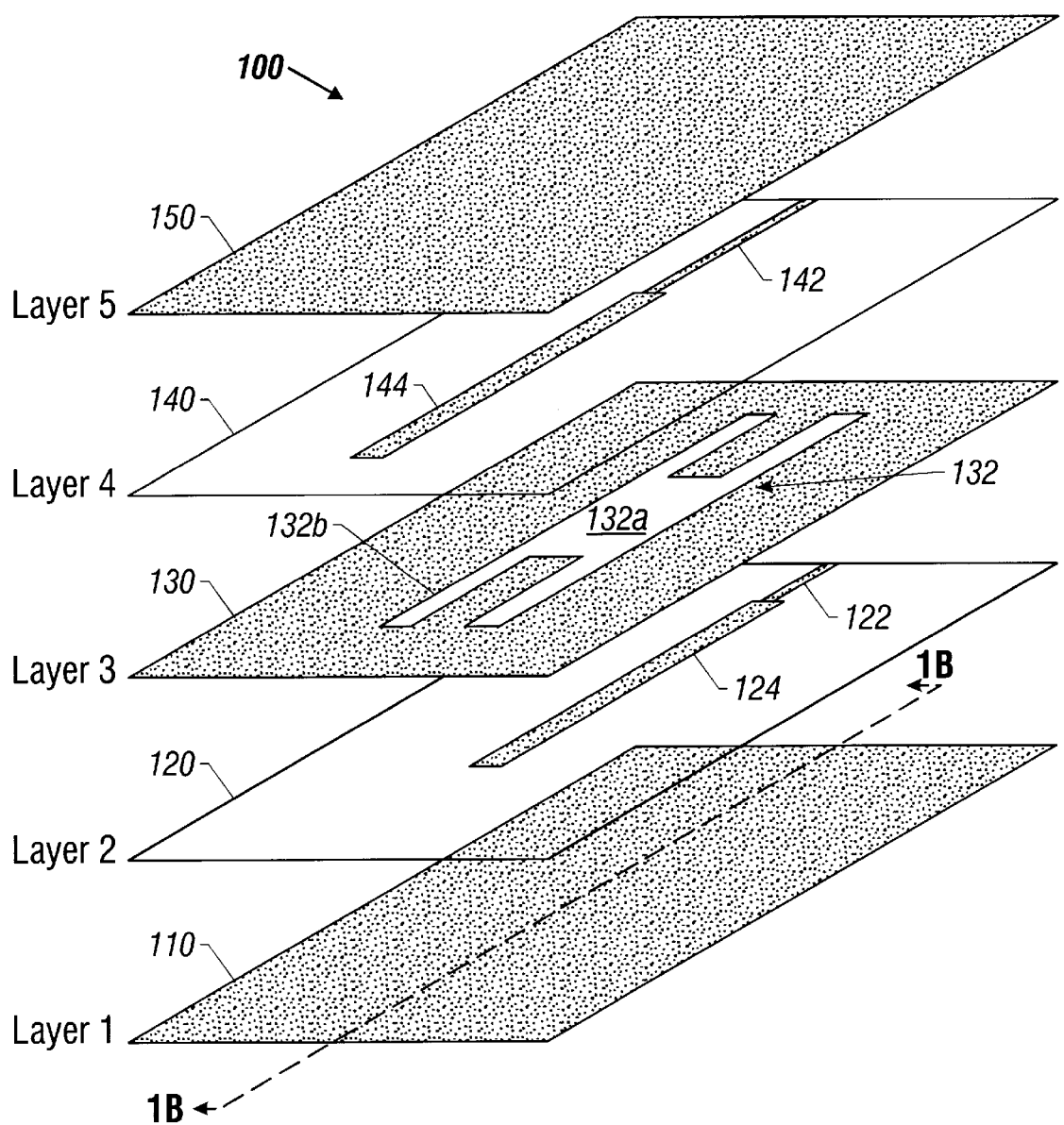
FIG. 1A is a perspective view of one embodiment of the stripline transition according to the invention.
Figure 1B:
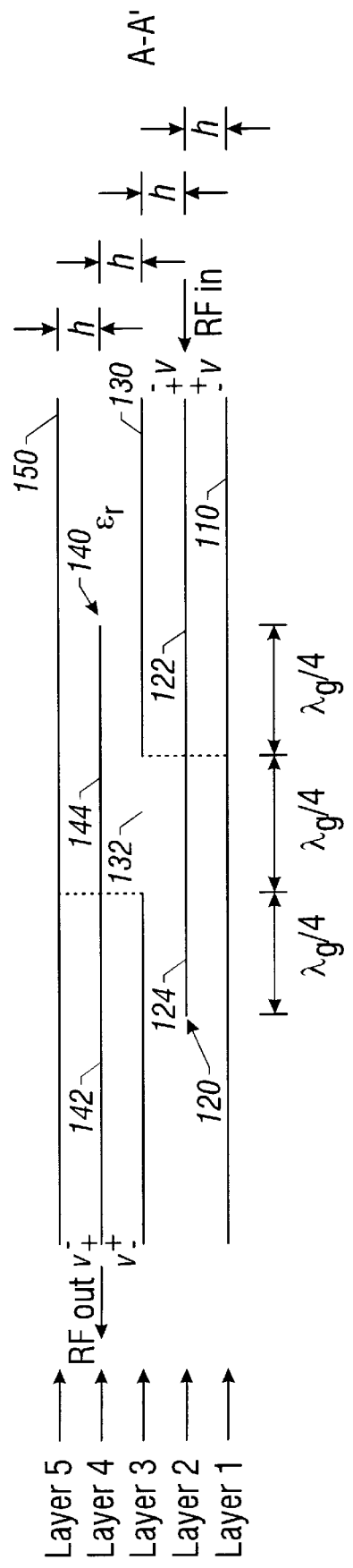
FIG. 1B is a side view of the embodiment shown in FIG. 1A along the line 1B—1B.

FIGS. 1A and 1B show one embodiment 100 of the stripline transition in a multilayer circuit. FIG. 1A is a perspective view of five consecutive layers 110, 120, 130, 140, and 150 in the circuit that are used to form the stripline transition. In general, a dielectric medium is filled between the layers. The layers 110, 130 and 150 are formed of a conducting material as the ground planes of the circuit. The center layer 130 has a coupling slot 132 to perturb the electrical field on the surfaces of the layer 130, thereby promoting energy coupling between layers 120 and 140. The layer 120 located between the layers 110 and 130 has a planar stripline 122 for transmitting electrical signals within the layer 120. A planar coupling electrode 124 in the layer 120 forms a terminator at an end of the stripline 122 for coupling the electrical signals between the layers 120 and 140. Preferably, the coupling electrode 124 has a rectangular shape elongated along the stripline 122. The layer 140 also includes a stripline 142 and a coupling electrode 144 that terminates the stripline 142. The characteristic impedances of the striplines 122 and 142 are preferably matched to have a substantially identical impedance $Z_{os}$ at a selected wavelength of the electrical signals.

The stripline 122 connecting to the coupling electrode 124 of the signal layer 120 and the stripline 142 connecting to the coupling electrode 144 of the signal layer 140 are substantially parallel relative to each other. The coupling electrodes 124 and 144 are aligned to at least partially overlap with each other and overlap with the coupling slot 132 in the layer 130 to promote energy coupling between the striplines 120 and 140. Preferably, each of the coupling electrodes 124 and 144 extends one quarter of the wavelength beyond the coupling slot 132.

FIG. 1B is a cross sectional view of the stripline transition 100 in FIG. 1A along the line 1B—1B that cuts through the center of the coupling slot 132, the coupling electrodes 124 and 144, and the striplines 122 and 142. The stripline 122 and the two neighboring ground planes 110 and 130 combine to form a first waveguide and the stripline 142 and the two neighboring ground planes 130 and 150 combine to form a second waveguide. A transition waveguide with an effective length equal to the length of the coupling slot along the direction of the striplines 122 and 142 is formed by the ground plane 110, the coupling electrodes 124 and 144, and the ground plane 150. This transition waveguide interconnects and transmits electrical signals between the first and second waveguide.

The dimension of the coupling electrodes 122 and 142 and the dimension and geometry of the coupling slot 132 are adjusted so that the characteristic impedance $Z_{op}$ of the transition waveguide is substantially equal to the characteristic impedance $Z_{os}$ of the first and second waveguides at the selected wavelength.

Although not necessarily required to implement the invention, the stripline transition 100 shown in FIGS. 1A and 1B uses substantially identical striplines (122 and 142) and coupling electrodes (124 and 144) in the layers 120 and 140. In addition, the layers 110, 120, 130, 140, and 150 in the stripline transition 100 are substantially equally spaced. The coupling slot 132 preferably has a rectangular aperture 132a with a length about one quarter of the selected wavelength and a width of approximately the same as that of the coupling electrodes 124 and 144. The length of the coupling electrodes 124 and 144 is about one half of the selected wavelength. Each of the coupling electrodes is positioned with respect to the coupling slot 132 so that the first half (about one quarter wavelength long) of the coupling electrode 124 (or 144) in contact with the stripline 122 (or 142) overlaps with the rectangular aperture 132a and the second half (about one quarter wavelength long) extends beyond the rectangular aperture 132a. FIGS. 2A, 2B, 2C, 2D, and 2E further show top views of the layers 110, 120, 130, 140, and 150 and their relative positions with respect to one another.

The embodiment 100 may also include four thin slits 132b of one quarter wavelength in length at the corners of the rectangular aperture 132a to form a "H"-shaped coupling slot 132. The width of the slits 132b is generally less than one quarter wavelength and preferably is less then one tenth of the selected wavelength. The H-shaped coupling slot can be used to achieve a higher coupling efficiency than the simple rectangular aperture 132a.

Figure 3A:
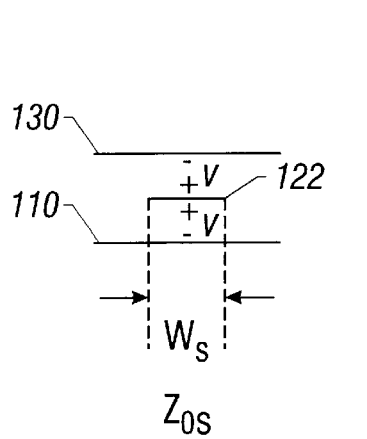
FIG. 3A is a cross sectional view of a first waveguide in the embodiment of FIG. 1A.
Figure 3B:
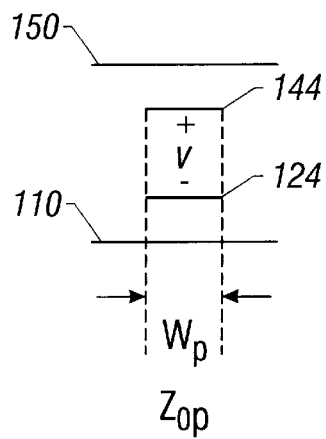
FIG. 3B is a cross sectional view of a transition waveguide formed at the coupling slot in the embodiment of FIG. 1A.
Figure 3C:
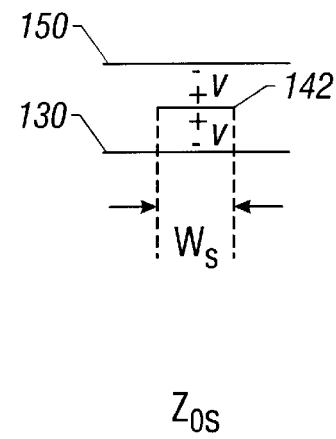
FIG. 3C is a cross sectional view of a second waveguide in the embodiment of FIG. 1A on a different layer from the first waveguide in FIG. 3A.

FIGS. 3A, 3B and 3C show cross sectional views of the first, the transition and the second waveguides. For a given dielectric constant of the medium between the layers and signals at the selected wavelength, the characteristic impedance of the first and second waveguides is $Z_{os}=Z_{os}(W_s,h)$ where $W_s$ is the wand 142 the striplines 122 and 142 and h is the spacing between two adjacent layers. Similarly, the characteristic impedance of the transition waveguide is determined by the width of the coupling electrodes 124 and 144, $W_s$, and h, i.e., $Z_{op}=Z_{op}(W_p,h)$. Therefore, $W_s$ and $W_p$ may be adjusted to achieve the impedance match: $Z_{os}=Z_{op}$.

Figure 4:
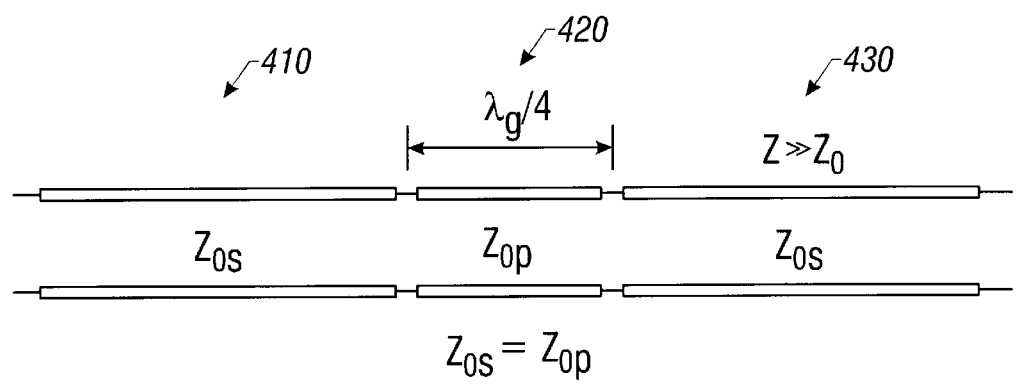
FIG. 4 is a diagram showing an equivalent circuit of the stripline transition of FIG. 1A.

FIG. 4 is a diagram of an equivalent circuit for the stripline transition 100. The sections 410, 420, and 430 respectively represent the first waveguide, the transition waveguide and the second waveguide.

The performance of the stripline transition 100 with a H-shaped coupling slot can be simulated by using a finite-difference time-domain method. See, Tulintseff, "The finite-difference time-domain method and computer program description applied to multilayered microstrip antenna and circuit configurations," Jet Propulsion Laboratory, JPL D-9605, March 1992, which is incorporated herein by reference. A simulation was performed on the stripline transition 100 configured for a signal at 1 GHz using the following parameters:

h=3.175 mm, $w_s$=7 mm, $w_p$=15 mm,

L=60 mm, t=5 mm, $Z_{os}$=61 ohms, $Z_{op}$=61 ohms, and

Dielectric constant of the filling medium: $\in_r$=1.1.

Figure 5:
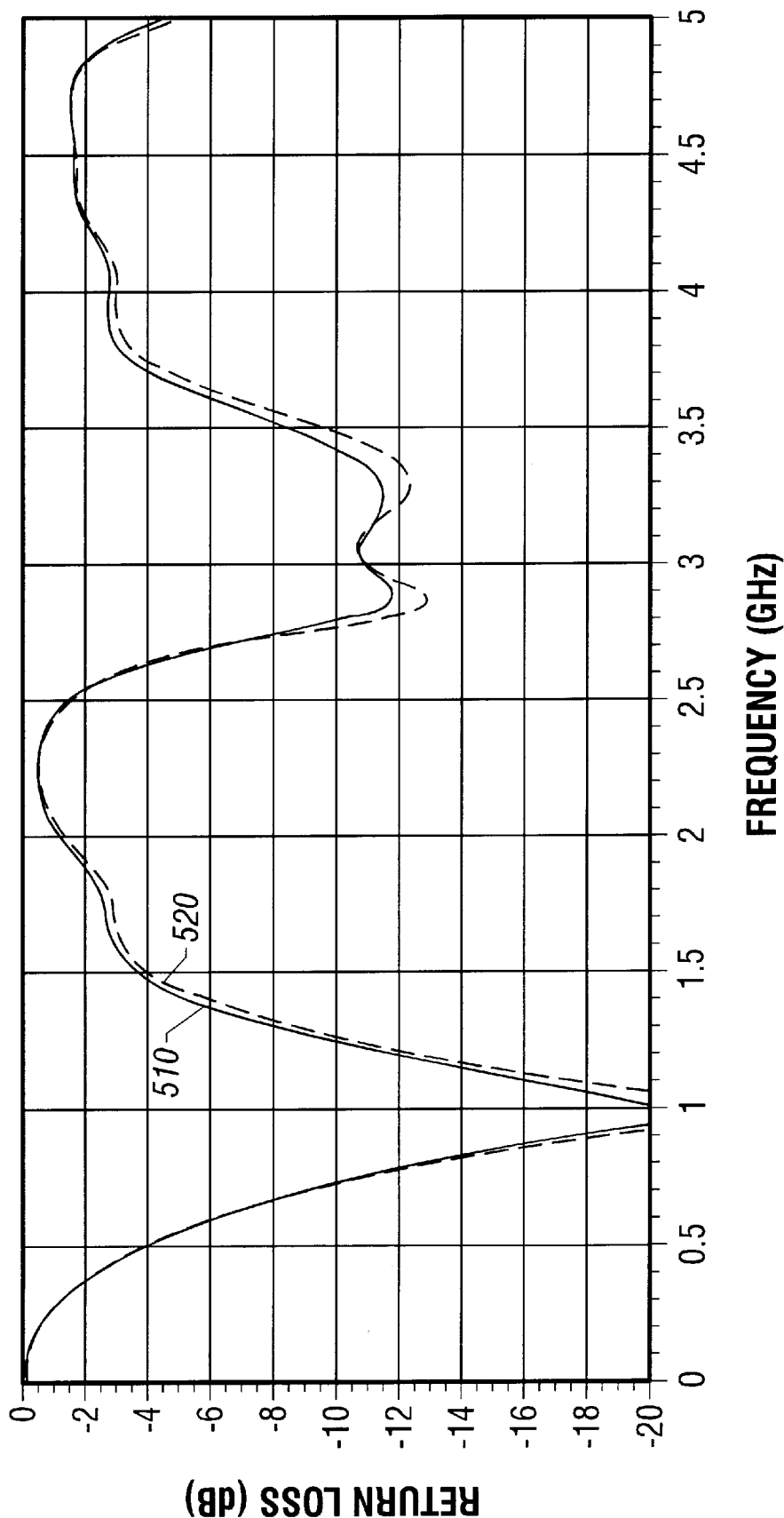
FIG. 5 is a chart of the return loss as a function of the signal frequency for a stripline transition based on the embodiment of FIG. 1A.
Figure 6:
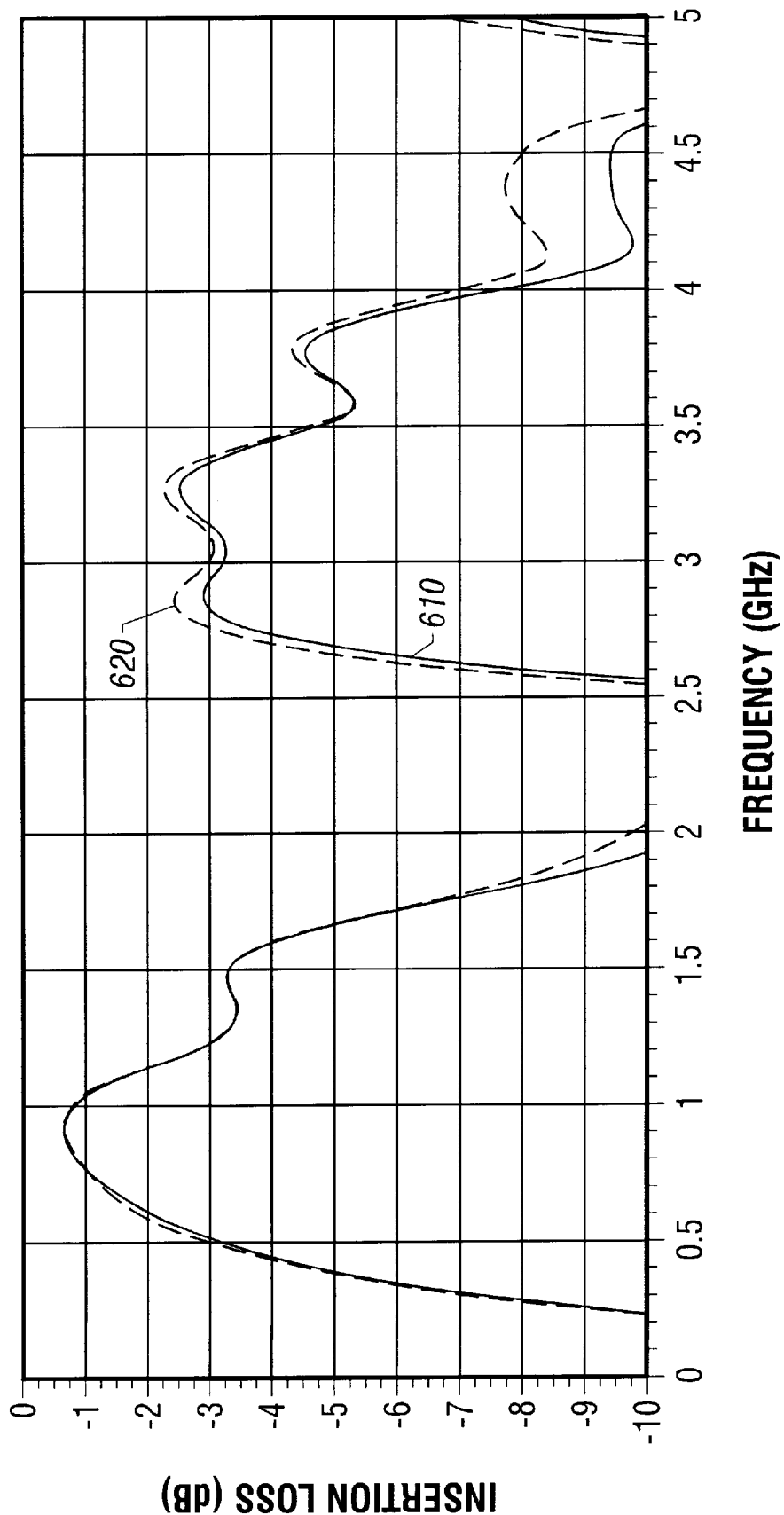
FIG. 6 is a chart of the insertion loss as a function of the signal frequency for the same stripline transition used in FIG. 5.

FIG. 5 is a chart showing the simulated return loss as a function of the signal frequency. At the design frequency of 1 GHz, the simulated return loss is more than 20 dB. FIG. 6 further shows the simulated insertion loss as a function of the signal frequency. A return loss of approximately −1.0 dB at the design frequency (i.e., 1 GHz) over about 20% to 25% of the bandwidth is shown by the simulation.

The simulations in FIGS. 5 and 6 also show the effects of the optional slots 112 and 152 in the ground planes 110 and 150. The solid-line curves (510 and 610) represent the simulation results without the optional slots and the dashed curves (520 and 620) represent the stimulation results with the optional slots 112 and 152. Implementation of the slots improves the coupling efficiency and increases the bandwidth of the stripline transition.

Figure 7:
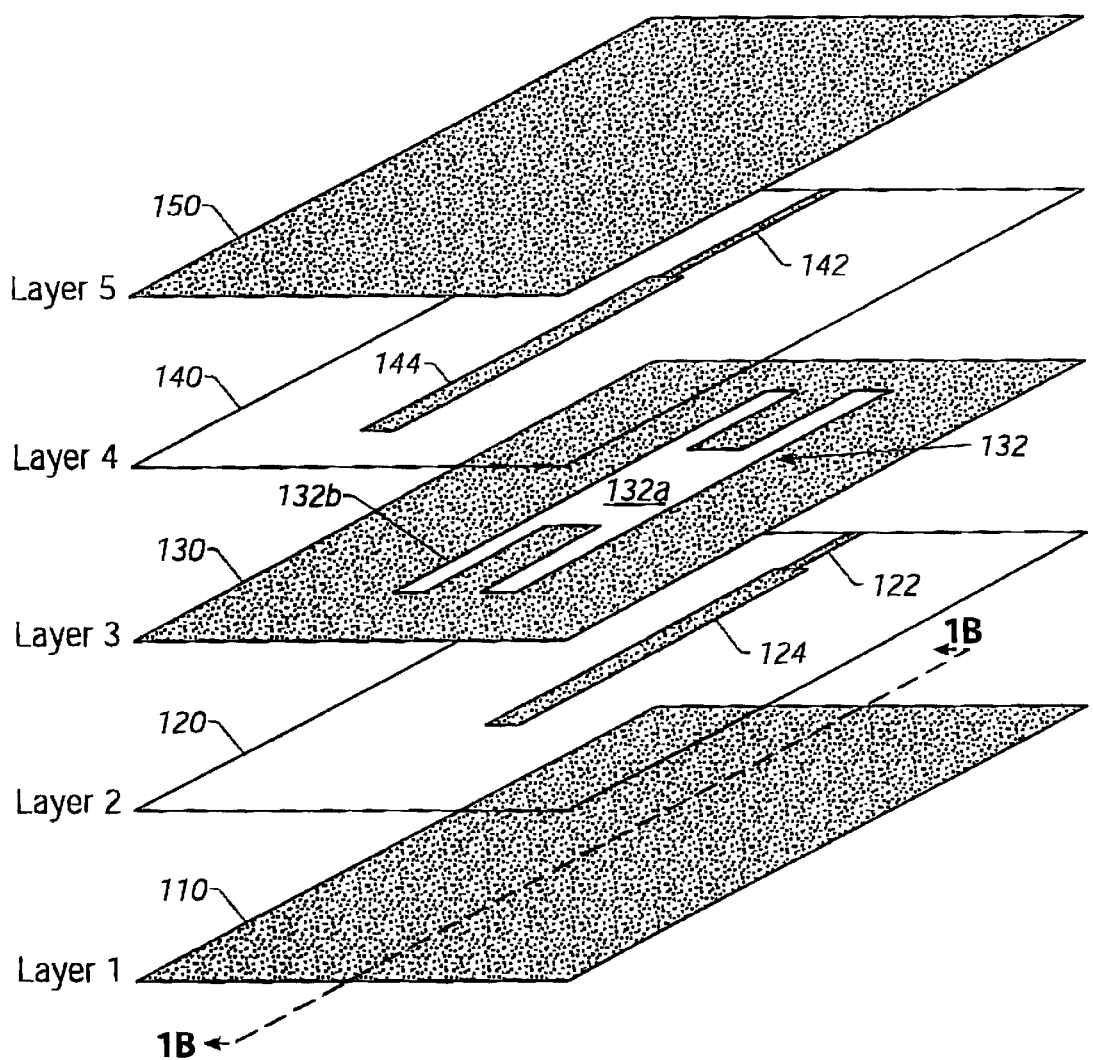
FIG. 7 shows a perspective view of another embodiment of the stripline transition.

Although the present invention has been described in detail with reference to the preferred embodiments, various modifications and enhancements may be made. For example, the spacing between different adjacent layers may be different and the striplines and coupling electrodes on the layers 120 and 140 may have different configurations as long as the impedances of the first waveguide, the transition waveguide and the second waveguide are substantially identical to one another. In addition, although the direction of the stripline 122 and its coupling electrode 124 in the layer 120 is shown in FIG. 1A to be opposite to the direction of the stripline 142 and its coupling electrode 144, they can be alternatively arranged in the same direction as shown in FIG. 7.

Furthermore, the two conducting layers 110 and 150 may each have an optional slot (112 and 152 in FIGS. 2A and 2E) to further improve the coupling efficiency between the two striplines 112 and 142.

These and other variations and modifications are intended to be encompassed by the appended claims.

What is claimed is:

1. An electrical device having a plurality of conducting layers for guiding electromagnetic signals at a selected wavelength, comprising:

first, second, and third conducting layers sequentially spaced from and disposed to overlap one another to form a stack, said second conducting layer configured to define an aperture as a coupling slot which is elongated in an elongated axis thereof;

a first elongated planar conductor configured to comprise a first stripline and a first coupling electrode elongated along said first stripline, said first planar conductor located between said first and second conducting layers to at least partially align said first coupling electrode with said coupling slot and to align said first stripline parallel to said elongated axis, wherein said first stripline combines with said first and second conducting layers to form a first waveguide of a first characteristic impedance for transmitting electromagnetic waves; and a second elongated planar conductor disposed between said second and third conducting layers in parallel to said first planar conductor, said second planar conductor having a structure substantially identical to said first planar conductor and comprising a second stripline and a second coupling electrode, wherein said second stripline combines with said second and third conducting layers to form a second waveguide having said first characteristic impedance and said second coupling electrode is at least partially aligned with said coupling slot along said elongated axis, wherein said first conducting layer, said first coupling electrode, said second coupling electrode, and said third conducting layer form a transition waveguide which effects an interconnection between said first and second waveguides and has a second characteristic impedance substantially equal to said first characteristic impedance, thereby promoting energy coupling between said first and second waveguides.

2. The device as in claim 1, wherein:

said coupling slot includes an elongated rectangular aperture with a length of approximately one quarter of said selected wavelength; and said first and second coupling electrodes each are rectangular with a length of approximately one half of said selected wavelength and are elongated along the elongated direction of said rectangular aperture and said first and said striplines.

3. The device as in claim 2, wherein the widths of said first and second striplines and said rectangular aperture and the spacings between said first conducting layer, said first planar conductor, said second conducting layer, said second planar conductor, and third conducting layer are configured to match said first and second characteristic impedances.

4. The device as in claim 2, wherein said first and second coupling electrodes each extend beyond said coupling slot along said elongated axis by approximately one quarter of said selected wavelength.

5. The device as in claim 2, wherein said coupling slot further comprises four narrow slits each with a length of approximately one quarter of said selected wavelength and a width smaller than one quarter of said selected wavelength, each of said narrow slits located at a corner of said rectangular aperture in parallel to said elongated axis such that said coupling slot effectively has a H-shape, wherein said four narrow slits operate to increase said energy coupling between said first and second waveguides.

6. The device as in claim 1, wherein said first and second conducting layers respectively have a first aperture positioned relative to said first coupling electrode and a second aperture positioned relative to said second coupling electrode to improve said energy coupling between said first and second waveguides.

7. The device as in claim 1, wherein said first and second planar conductors are arranged in the same direction.

8. The device as in claim 1, wherein said first and second planar conductors are arranged in opposite directions.

9. The device as in claim 1, further comprising a dielectric medium between said first conducting layer, said first planar conductor, said second conducting layer, said second planar conductor, and third conducting layer.

10. An electrical device having a plurality of conducting layers for guiding electromagnetic signals at a selected wavelength, comprising:

first, second, and third conducting layers sequentially spaced from and disposed to overlap one another to form a stack, said second conducting layer configured to define a rectangular coupling aperture along an elongated axis with a length of about one quarter of said selected wavelength;

a first elongated planar conductor configured to comprise a first stripline and a first rectangular coupling electrode that has a length of about one half of said selected wavelength and is elongated along said first stripline, said first planar conductor located between said first and second conducting layers to at least partially align said first coupling electrode with said coupling aperture and to align said first stripline parallel to said elongated axis, wherein said first stripline combines with said first and second conducting layers to form a first waveguide of a first characteristic impedance for transmitting electromagnetic waves; and a second elongated planar conductor disposed between said second and third conducting layers in parallel, said second planar conductor having a structure substantially identical to said first planar conductor and comprising a second stripline and a second rectangular coupling electrode, said second planar conductor orientated with respect to said first planar conductor in an opposite direction, wherein said second stripline combines with said second and third conducting layers to form a second waveguide having said first characteristic impedance and said second coupling electrode is at least partially aligned with said coupling aperture along said elongated axis, wherein said first conducting layer, said first coupling electrode, said second coupling electrode, and said third conducting layer form a transition waveguide between said first and second waveguides for promoting energy coupling therebetween, said transition waveguide having a second characteristic impedance substantially equal to said first characteristic impedance.

11. The device as in claim 10, wherein the widths of said first and second striplines and said rectangular coupling aperture and the spacings between said first conducting layer, said first planar conductor, said second conducting layer, said second planar conductor, and third conducting layer are configured to match said first and second characteristic impedances.

12. The device as in claim 10, wherein said first and second coupling electrodes each extend beyond said coupling aperture along said elongated axis by approximately one quarter of said selected wavelength such that a portion of said first coupling electrode partially overlaps said second stripline and a portion of said second coupling electrode partially overlaps said first stripline.

13. The device as in claim 10, wherein said coupling aperture further comprises four narrow slits each with a length of approximately one quarter of said selected wavelength and a width smaller than one quarter of said selected wavelength, each of said narrow slits located at a corner of said rectangular aperture in parallel to said elongated axis such that said coupling aperture effectively has a H-shape, wherein said four narrow slits operate to increase said energy coupling between said first and second waveguides.

14. The device as in claim 10, wherein:

said first conducting layer is configured to define a first slot positioned relative to said first coupling electrode and spaced from said first stripline for suppressing a wave propagation in said first planar conductor directed from said first stripline to said first coupling electrode beyond said first coupling electrode; and said second conducting layer is configured to define a second slot positioned relative to said second coupling electrode and spaced from said second stripline for suppressing a wave propagation in said second planar conductor directed from said second stripline to said second coupling electrode beyond said second coupling electrode;

whereby said first and second slots operate to improve said energy coupling between said first and second waveguides.

15. A device having conducting layers for guiding electromagnetic signals at a selected wavelength, comprising:

first, second, and third conducting layers sequentially spaced from and disposed to overlap one another to form a stack, said second conducting layer configured to define an aperture as a coupling slot which is elongated in an elongated axis thereof;

a first elongated planar conductor located between said first and second conducting layers and comprising a first stripline parallel to said elongated axis to have an end that is aligned with one side of said coupling slot, and a first coupling electrode connected to said end of said first stripline and elongated along said elongated axis to at least partially overlap said coupling slot and to extend beyond another side of said coupling slot opposing said one side, wherein said first stripline combines with said first and second conducting layers to form a first waveguide of a first characteristic impedance for transmitting electromagnetic waves; and a second elongated planar conductor located between said second and third conducting layers in parallel to said first planar conductor, said second planar conductor having a second stripline parallel to said elongated axis to have an end that is aligned with one side of said coupling slot, and a second coupling electrode connected to said end of said second stripline and elongated along said elongated axis to at least partially overlap said coupling slot and to extend beyond another side of said coupling slot opposing said one side, wherein said second stripline combines with said second and third conducting layers to form a second waveguide of said first characteristic impedance for transmitting electromagnetic waves, wherein said first conducting layer, said first coupling electrode, said second coupling electrode, and said third conducting layer form a transition waveguide which effects an interconnection between said first and second waveguides and has a second characteristic impedance substantially equal to said first characteristic impedance, thereby promoting energy coupling between said first and second waveguides.

16. A device as in claim 15, wherein said first conducting layer is configured to define a first slot positioned over one end of said first coupling electrode opposing another end that is connected to said first stripline; and wherein said second conducting layer is configured to define a second slot positioned over one end of said second coupling electrode opposing another end that is connected to said second stripline.

17. A device as in claim 15, wherein said coupling slot is approximately one quarter of said selected wavelength along said elongated axis.

18. A device as in claim 17, wherein each of said first and second coupling electrodes is approximately one half of said selected wavelength along said elongated axis so that each extends beyond said coupling slot by approximately one quarter of said selected wavelength.

19. A device as in claim 15, wherein said coupling slot is rectangular in shape and has four narrow slits each with a length of approximately one quarter of said selected wavelength and a width smaller than one quarter of said selected wavelength, each of said narrow slits located at a corner of said rectangular aperture in parallel to said elongated axis such that said coupling slot effectively has a H-shape to increase energy coupling between said first and second waveguides.

* * * * *